United States Patent [19]
Pan et al.

[11] Patent Number: 6,067,680
[45] Date of Patent: May 30, 2000

[54] SEMICONDUCTOR PROCESSING METHOD OF FORMING A CONDUCTIVELY DOPED SEMICONDUCTIVE MATERIAL PLUG WITHIN A CONTACT OPENING

[75] Inventors: Pai-Hung Pan; Sujit Sharan; Kirk Prall, all of Boise, Id.

[73] Assignee: Micron Technology, Inc., Boise, Id.

[ * ] Notice: This patent is subject to a terminal disclaimer.

[21] Appl. No.: 09/070,127

[22] Filed: Apr. 29, 1998

[51] Int. Cl.$^7$ ................................................ H01L 21/22
[52] U.S. Cl. .............................. 9/1; 438/647; 438/657; 438/661
[58] Field of Search ..................... 438/565, 647, 438/566, 486, 657, 661

[56] References Cited

U.S. PATENT DOCUMENTS

| | | | |
|---|---|---|---|
| 5,141,892 | 8/1992 | Beinglass | 437/233 |
| 5,192,708 | 3/1993 | Beyer et al. | 437/233 |
| 5,244,835 | 9/1993 | Hachiya | 437/191 |
| 5,371,039 | 12/1994 | Oguro | 437/191 |
| 5,420,074 | 5/1995 | Ohshima | 437/193 |
| 5,439,838 | 8/1995 | Yang | 437/52 |
| 5,491,104 | 2/1996 | Lee et al. | 437/52 |
| 5,567,644 | 10/1996 | Rolfson et al. | 438/384 |
| 5,759,905 | 6/1998 | Pan et al. | 438/565 |
| 5,976,961 | 11/1999 | Jung et al. | 438/592 |

FOREIGN PATENT DOCUMENTS 1-205525  8/1989  Japan .

*Primary Examiner*—Wael Fahmy
*Assistant Examiner*—Kurt Eaton
*Attorney, Agent, or Firm*—Wells, St. John, Roberts, Gregory & Matkin, P.S.

[57] ABSTRACT

A semiconductor processing method of forming a conductively doped semiconductive material plug within a contact opening includes, a) providing a node location and a plug molding layer outwardly thereof; b) providing a contact opening through the plug molding layer to the node location; c) providing a first layer of semiconductive material over the molding layer to within the contact opening, the first layer thickness being less than one-half the contact opening width to leave a first remaining opening, the first layer having an average conductivity enhancing dopant concentration from 0 atoms/cm$^3$ to about 5×10$^{18}$ atoms/cm$^3$; d) after providing the first layer, increasing the average conductivity enhancing dopant concentration of the first layer to greater than or equal to about 1×10$^{19}$ atoms/cm$^3$; e) after increasing the dopant concentration of the first layer, providing a second layer of semiconductive material over the first layer and to within the first remaining opening, the second layer having an average conductivity enhancing dopant concentration from 0 atoms/cm$^3$ to about 5×10$^{18}$ atoms/cm$^3$; f) after providing the second layer within the first remaining opening, increasing the average conductivity enhancing dopant concentration of the second layer to greater than or equal to about 1×10$^{19}$ atoms/cm$^3$; and g) providing the contact opening to be substantially filled with semiconductive material having an average conductivity enhancing dopant concentration of greater than or equal to about 1×10$^{19}$ atoms/cm$^3$ to define a conductively doped semiconductive material plug within the contact opening.

9 Claims, 3 Drawing Sheets

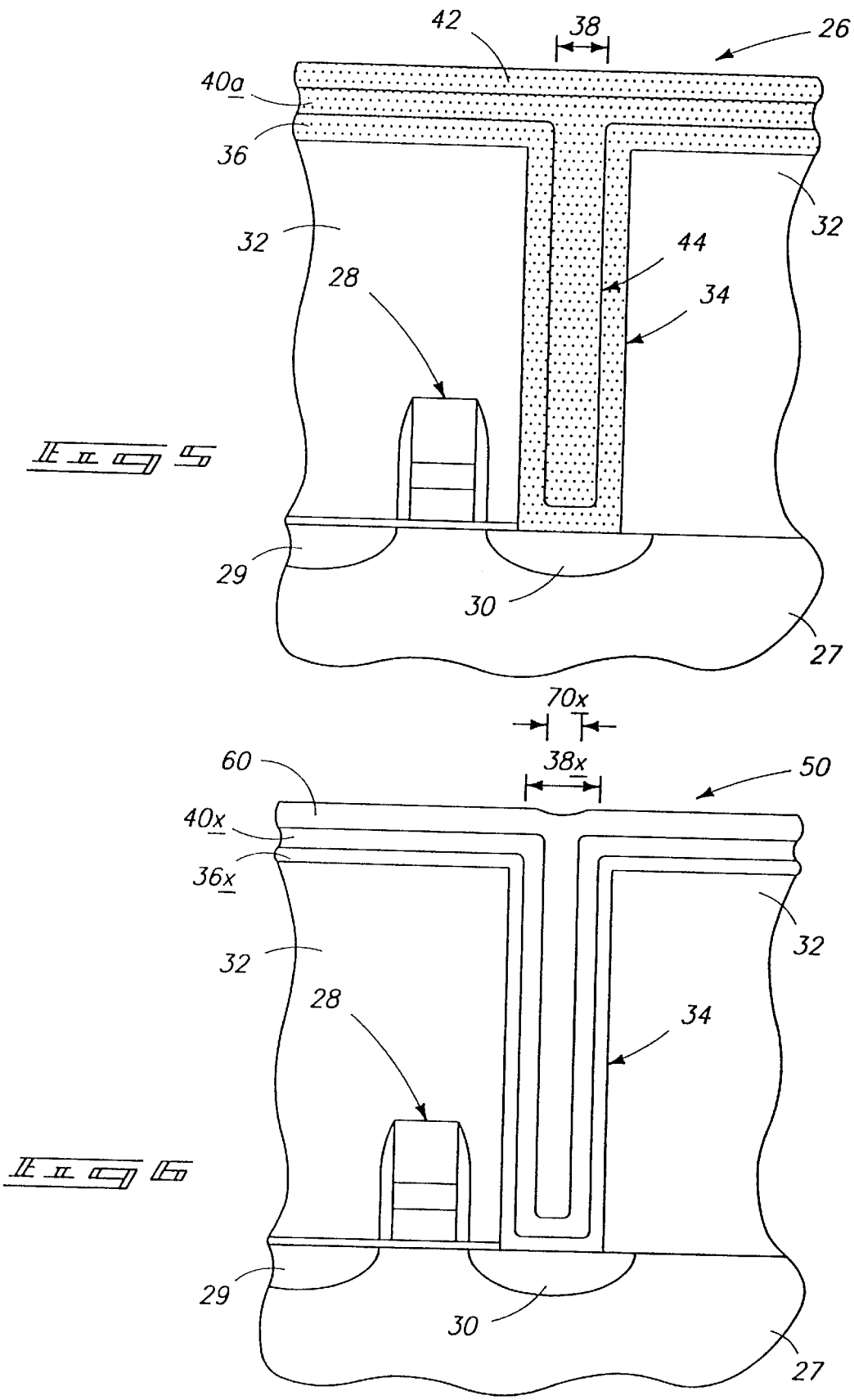

SEMICONDUCTOR PROCESSING METHOD OF FORMING A CONDUCTIVELY DOPED SEMICONDUCTIVE MATERIAL PLUG WITHIN A CONTACT OPENING

RELATED PATENT DATA

This patent resulted from continuation application of U.S. patent application Ser. No. 08/956,918, which is a file wrapper continuation application of U.S. patent application Ser. No. 08/580,631, now abandoned.

TECHNICAL FIELD

This invention relates to semiconductor processing methods of forming conductively doped semiconductive material plugs within contact openings.

BACKGROUND OF THE INVENTION

In the processing of integrated circuits, electric contact must be made to isolated active device regions formed within a wafer/substrate. The active device regions are connected by high electrically conductive paths or lines which are fabricated above an electrically insulative material, which covers the substrate surface. To provide electrical connection between the conductive path and active-device regions, an opening in the insulator is provided to enable the conductive films to contact the desired regions. Such openings are typically referred to as contact openings, or simply as "contacts". The term also applies to any opening provided in an insulating layer to make electrical connection to a lower elevation conductive node. The contacts are typically filled with a highly conductive material, with the resultant construction constituting a plug within the contact opening.

Further, multi-level metalization is a critical area of concern in advanced semiconductor fabrication where designers continue to strive for circuit density maximization. Metalization interconnect techniques typically require electrical connect between metal layers or runners occurring at different elevations within a semiconductor substrate. Such is typically conducted, in part, by etching a contact opening through insulating material to the lower elevation metal layer. Increased circuit density has resulted in narrower and deeper electrical contact openings between layers within the substrate. Adequate contact coverage within these deep and narrow contacts continues to challenge the designer.

The electrically conductive filling material utilized for filling contact openings typically comprises conductively doped polysilicon or metal. In the context of this document, "metal" is intended to broadly define any metal alloy, elemental metal, or metal compound whose electrically conductive properties are defined by a resistivity less than 2000 microohm-cm. Further, combinations of these materials are often used. For example, metal or metal compounds are typically utilized within contact openings to provide suitable interconnection and barrier layers between underlying substrates and overlying conductive materials.

As contact openings become narrower and deeper, it becomes more difficult for the artisan to completely fill the contact openings. One preferred method of depositing polysilicon in a manner having high conformality is by chemical vapor deposition. In such processes, reactive gases are combined within a chemical-vapor deposition reactor under conditions effective to deposit a desired film, such as silicon, atop the wafer and conformally within deep contact openings. One typical process for depositing polycrystalline silicon includes feeding of silane gas to a reactor with the substrate maintained at a temperature of 650° C., with the reactor ambient being at 80 Torr. Such will provide a highly conformal layer of polycrystalline silicon as-deposited to deep within narrow contact openings. However, such polysilicon as-deposited will effectively function as an electrically insulative material. Polysilicon can be rendered electrically conductive by providing conductivity enhancing impurity dopants into the layer either during or after deposition. One after-deposition technique is by ion implantation. However, this technique is largely ineffective for doping material within a long, deep contact opening.

Doping can be provided in situ by combining dopant impurity gases with the silane or other silicon precursor gas during the deposition process. The typical average concentration of dopant impurity required to produce adequate electrical conductivity exceeds $1 \times 10^{20}$ atoms/cm$^3$. However unfortunately, conformality in the deposition diminishes significantly in in situ processes which provide dopant impurity concentration of higher than $5 \times 10^{18}$ atoms/cm$^3$.

The problem is illustrated in FIG. 1. There, a semiconductor wafer fragment 10 includes a bulk silicon substrate 12, a field effect transistor gate construction 14 and adjacent source/drain diffusion regions 16 and 18. An insulating layer 20, or other suitable contact opening molding layer, is provided outwardly of substrate 12 over gate 14 and diffusion regions 16 and 18. A contact opening 22 is cut therethrough for outwardly exposing and making electrical connection with diffusion region 18. A layer 24 of polysilicon having conductivity enhancing impurity dopant of greater than or equal to about $5 \times 10^{18}$ atoms/cm$^3$ is deposited atop molding layer 20 to within contact opening 22. However due to the high dopant concentration, contact opening 22 is less than completely filled, leaving an undesired void or key-hole 25 therewithin.

It would be desirable to develop alternate processes which enable provision of heavily doped polysilicon or other semiconductive material plugs within contact openings having a conductivity dopant impurity concentration of greater than $5 \times 10^{18}$ atoms/cm$^3$ which are free of such voids.

BRIEF DESCRIPTION OF THE DRAWINGS

Preferred embodiments of the invention are described below with reference to the following accompanying drawings.

FIG. 5 is a view of the FIG. 2 wafer fragment at a processing step subsequent to that shown by FIG. 4.

FIG. 6 is a diagrammatic sectional view of an alternate embodiment semiconductor wafer fragment at a processing step in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

3

In accordance with one aspect of the invention, a semiconductor processing method of forming a conductively doped semiconductive material plug within a contact opening comprises the following steps:

provide a node location to which electrical connection with a conductively doped semiconductive material plug is to be made;

providing a plug molding layer outwardly of the node location;

providing a contact opening through the plug molding layer to the node location, the contact opening having an opening width;

providing a first layer of semiconductive material over the molding layer to within the contact opening, the first layer being provided to a thickness which is less than one-half the contact opening width to less than completely fill the contact opening with the first layer and leave a first remaining opening, the first layer of semiconductive material having an average conductivity enhancing dopant concentration from 0 atoms/cm$^3$ to about 5×10$^{18}$ atoms/cm$^3$;

after providing the first layer within the contact opening, increasing the average conductivity enhancing dopant concentration of the first layer to greater than or equal to about 1×10$^{19}$ atoms/cm$^3$;

after increasing the dopant concentration of the first layer, providing a second layer of semiconductive material over the first layer and to within the first remaining opening, the second layer of semiconductive material having an average conductivity enhancing dopant concentration from 0 atoms/cm$^3$ to about 5×10$^{18}$ atoms/cm$^3$;

after providing the second layer within the first remaining opening, increasing the average conductivity enhancing dopant concentration of the second layer to greater than or equal to about 1×10$^{19}$ atoms/cm$^3$; and providing the contact opening to be substantially filled with semiconductive material having an average conductivity enhancing dopant concentration of greater than or equal to about 1×10$^{19}$ atoms/cm$^3$ to define a conductively doped semiconductive material plug within the contact opening.

Figure 1:
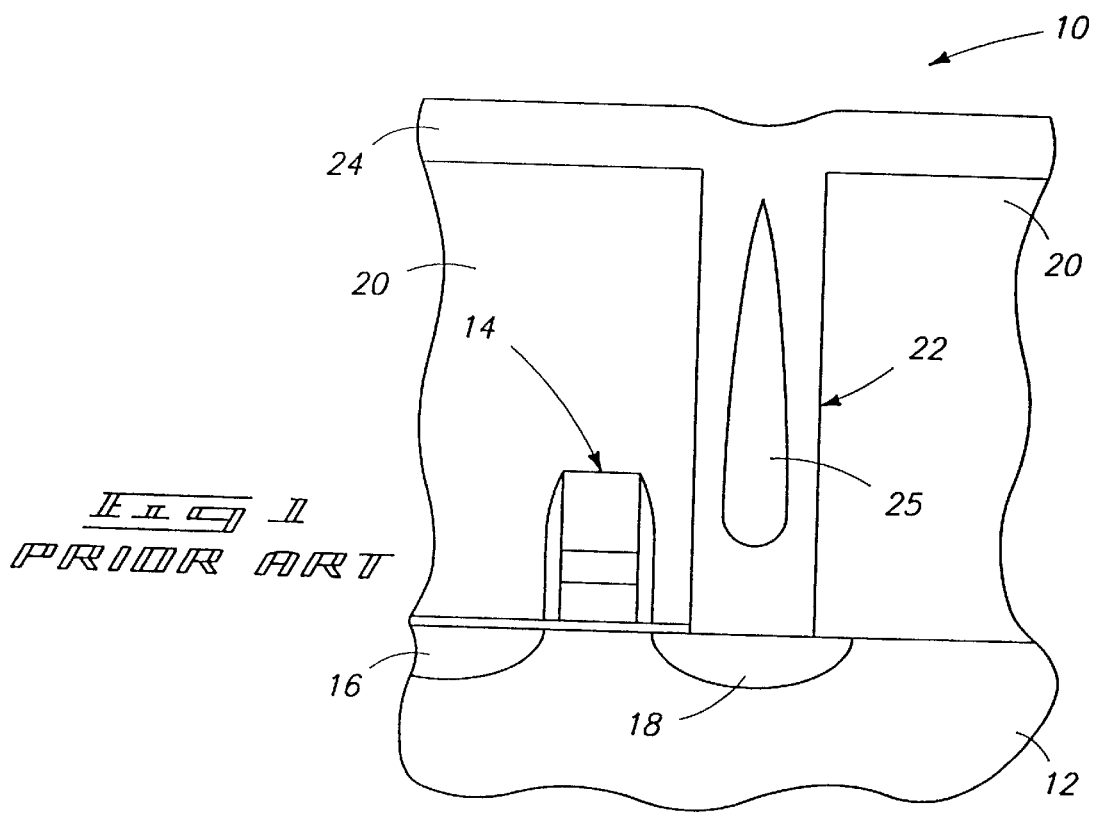
FIG. 1 is a diagrammatic sectional view of a prior art semiconductor wafer fragment and is discussed in the "Background" section above.
Figure 2:
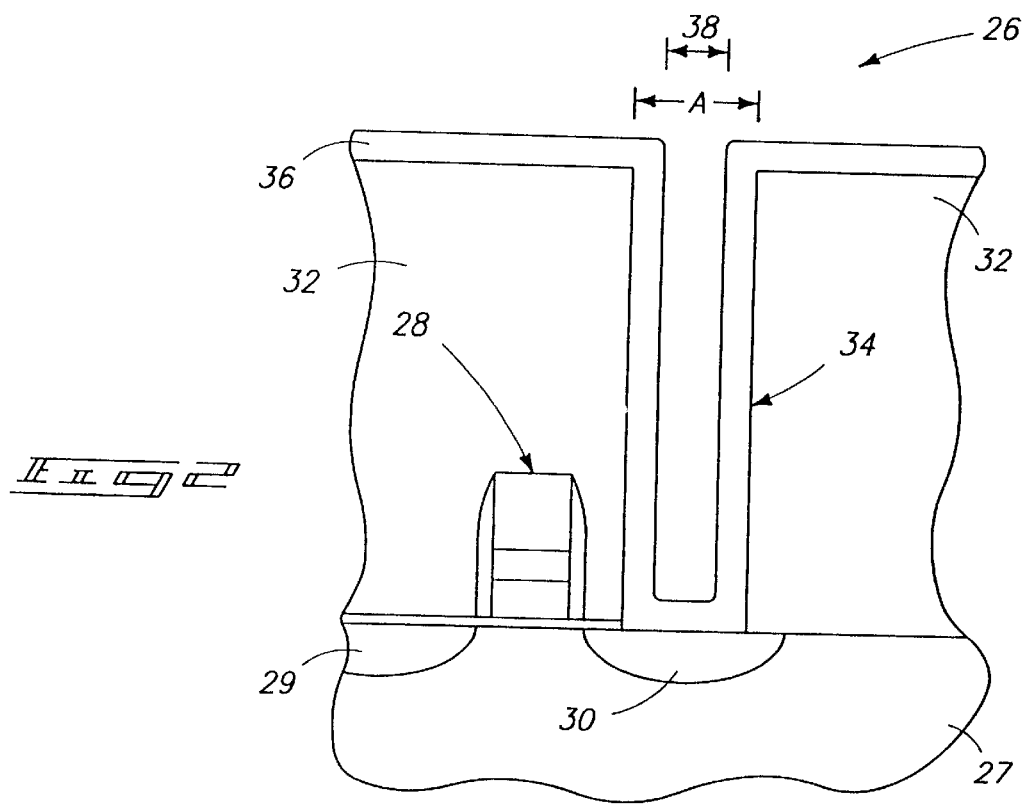
FIG. 2 is a diagrammatic sectional view of a semiconductor wafer fragment at one processing step in accordance with the invention.

Referring to FIG. 2, a semiconductor wafer fragment in process is indicated generally with reference numeral 26. Such comprises a bulk silicon substrate 27, a word line or gate construction 28, and adjacent source/drain diffusion regions 29 and 30. In the context of this example, the upper surface of substrate 27 at diffusion region 30 constitutes a node location to which electrical connection with a conductively doped semiconductive material plug is to be made. A plug molding layer 32 is provided outwardly of substrate 27, word line 28 and diffusion regions 29 and 30. Such preferably predominantly comprises SiO$_2$, such as borophosphosilicate glass (BPSG). A contact opening 34 is provided through molding layer 32 to node location 30. For purposes of the continuing discussion, contact opening 34 has an opening width "A". By way of example only, an example "A" width is 4000 Angstroms, with an example depth of contact opening 34 being 20,000 Angstroms. A first layer 36 of semiconductive material is provided over molding layer 32 to within contact opening 34 to a thickness which is less than one-half contact opening width "A". Thus, contact opening 34 is less than completely filled with first layer material, leaving a first remaining opening 38. As deposited, first layer 36 of semiconductive material is provided to have an average low conductivity enhancing dopant concentra-

4 tion from 0 atoms/cm$^3$ to about 5×10$^{18}$ atoms/cm$^3$. Such will facilitate provision of a highly conformal layer within contact opening 34 as shown.

Figure 3:
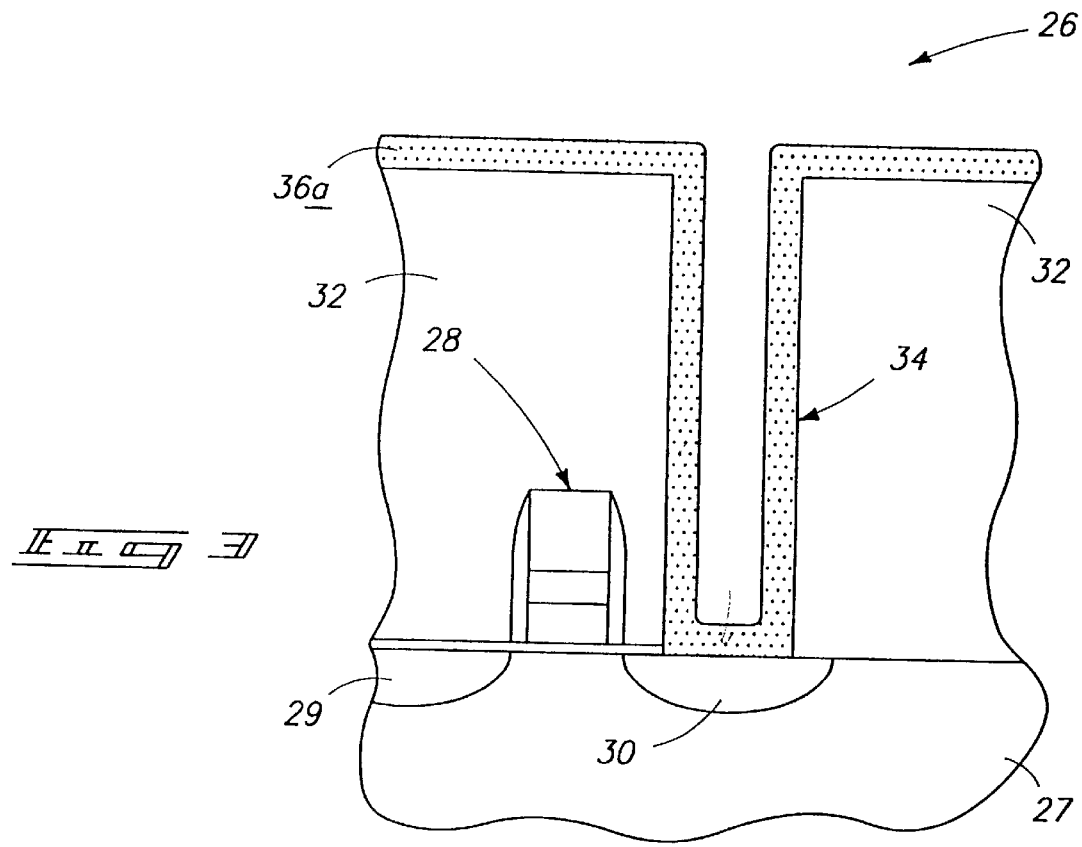
FIG. 3 is a view of the FIG. 2 wafer fragment at a processing step subsequent to that shown by FIG. 2.

Referring to FIG. 3, the average conductivity enhancing dopant concentration of first layer 36 is increased to a value greater than or equal to about 1×10$^{19}$ atoms/cm$^3$, and preferably to a value at least as great as 5×10$^{20}$ atoms/cm$^3$ to provide effective resultant electrical conductivity thereof, and modified layer 36a. Example techniques for increasing or inherently providing such higher concentration of impurity dopants would include ion implantation (less preferred) or gas diffusion (most preferred). Example dopant gases include PH$_3$, AsH$_3$ and B$_2$H$_6$. Preferably, gas diffusion is conducted in the same chemical vapor deposition reactor in which layer 36 was provided. For example once layer 36 is provided to its desired thickness, the flow of precursor gases fed to the reactor could be ceased and provision of a conductivity impurity dopant gas, such as phosphine, added or be significantly increased to the reactor and maintained therein for a period of time suitable to provide the desired resultant impurity concentration of greater than 1×10$^{19}$ atoms/cm$^3$. Alternately but less preferred, the gas diffusion or other doping could be conducted in a separate reactor or controlled chamber.

Figure 4:
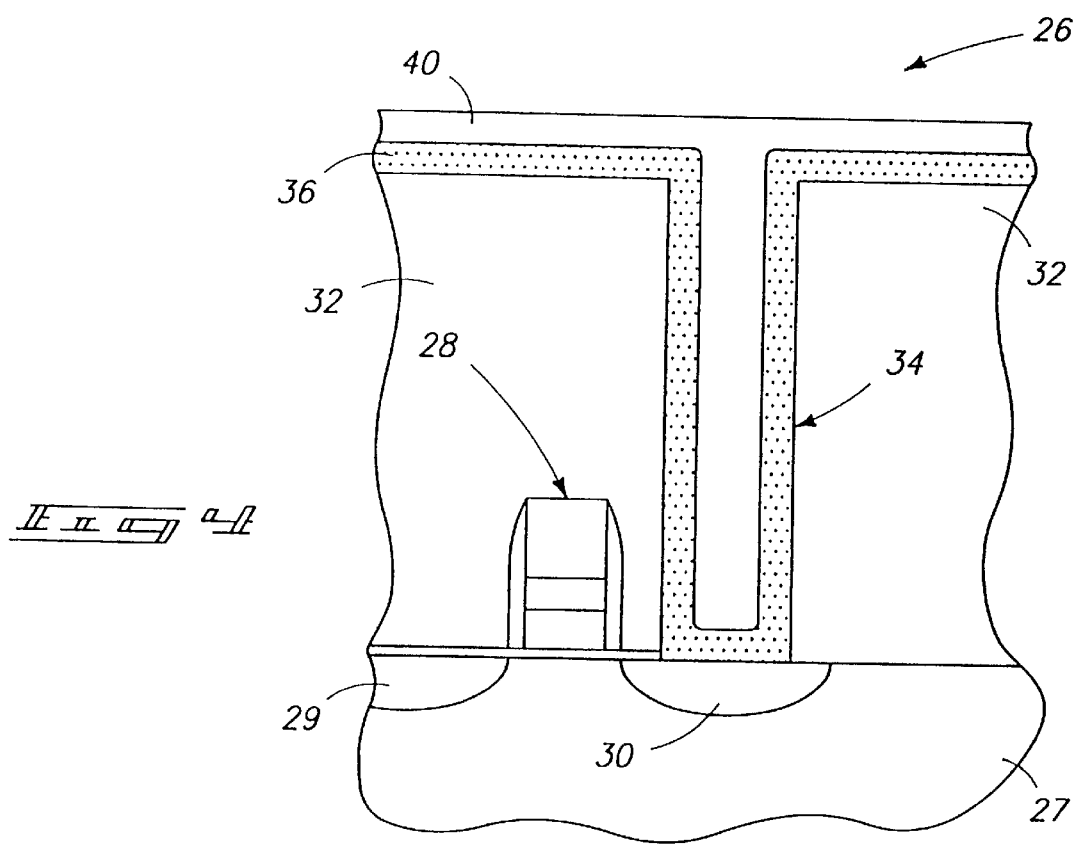
FIG. 4 is a view of the FIG. 2 wafer fragment at a processing step subsequent to that shown by FIG. 3.

Referring to FIG. 4 and after increasing the dopant concentration 14 of first layer 36 to layer 36a, a second layer 40 of semiconductive material is provided over first layer 36a and to within first remaining opening 38. Second layer 40 as deposited is provided to have an average low conductivity enhancing dopant concentration from 0 atoms/cm$^3$ to about 5×10$^{18}$ atoms/cm$^3$. Preferably, layer 40 constitutes the same base semiconductive material of layer 36, with the preferred material being silicon. In this described example, second layer 40 is deposited to completely fill first remaining opening 38.

Referring to FIG. 5, the average conductivity enhancing dopant concentration of second layer 40 is increased to greater than or equal to about 1×10$^{19}$ atoms/cm$^3$, and preferably to greater than 5×10$^{20}$ atoms/cm$^3$, to provide a second layer 40a. Again, such diffusion can be conducted by gas diffusion. Alternately if adequate, such diffusion can be conducted by out diffusion of conductivity enhancing impurity form layer 36a. In such evens, concentration of dopant impurity within layer 36a will be provided to be significantly greater than 1×10$^{19}$ atoms/cm$^3$ to enable an average resultant overall concentration of the plugging material which will be greater than 1×10$^{19}$ atoms/cm$^3$. Subsequently, an outer conductive layer 42 can be provided to provide a desired thickness of a conductive layer above molding layer 32 for patterning into conductive lines or other circuit components. The resultant construction defines a conductively doped semiconductive material plug 44 within contact opening 34.

Layers 36 and 40 as-deposited by way of example only can alternately be provided as amorphous silicon or as polycrystalline silicon. For example as known to people skilled in the art, the deposition temperature of 585° C. defines a transition temperature which is determinative of whether a silicon layer as deposited is amorphous or polycrystalline. Depositions at greater than 585° C. tend to inherently be polycrystalline, whereas deposition temperatures below 585° C. tend to inherently be amorphous. If deposited as amorphous, subsequent wafer processing typically subjects the silicon material to effective thermal conditions to transform the amorphous layer into a polycrystalline silicon material. Regardless, preferably the provision of the first and second layers and the increasing of the respective dopant concentrations occur in a single chemical vapor deposition reactor without breaking vacuum among the processing steps. Also preferably, layers 36 and 40 as-deposited prior to increasing dopant concentrations are preferably provided to have minimal or no conductivity dopant concentration to maximize the conformal deposition effect.

The above described process completely filled contact opening 34 in only two deposition steps. Alternately, a larger number of lightly doped layers might be provided for completely filling the contact openings. Typically, the higher the desired conductivity dopant concentration, the more and thinner the deposited layers will desirably be in order to facilitate conformality and achieve resultant high dopant concentration. Preferably, each intervening layer will be subjected to a gas diffusion doping immediately after its deposition, although such might be eliminated with respect to some intervening layers with adequate doping thereof being provided by out diffusion from previous or subsequently deposited layers. Regardless, the resultant effect will be to substantially fill contact opening 34 with semiconductive material having an average conductivity enhancing dopant concentration of greater than or equal to about $1 \times 10^{19}$ atoms/cm$^3$.

FIG. 6 illustrates such an alternate embodiment wafer fragment 50. Like numerals from the first described embodiment are utilized where appropriate with differences being indicated with the suffix "x" or with different numerals. Here, a series of a first layer 36x, a second layer 40x, and a third layer 60 are provided. Layer 36x is provided to a thinner thickness to provide a slightly wider first remaining opening 38x. Layer 40x is deposited to a thickness which less than completely fills first remaining contact opening 38x, thus leaving a second remaining opening 70. Third layer 60 of semiconductive material is provided over second layer 40x and to within second remaining opening 70, and initially provided to an average conductivity enhancing dopant concentration of from 0 atoms/cm$^3$ to about $5 \times 10^{18}$ atoms/cm$^3$. Subsequently, its concentration is increased to greater than or equal to about $1 \times 10^{19}$ atoms/cm$^3$.

Below are two examples.

Run #1:

Pressure: 80 Torr

Temperature: 630 degrees C

SiH$_4$ flow: 0.5 slm

Deposit for 150 seconds to get 3000 Angstroms thick undoped layer, then turn off SiH$_4$, and turn on PH$_3$. Run PH$_3$ for 60 seconds. Turn off PH$_3$, and turn on SiH$_4$ at 0.5 slm for 150 seconds at 630 degrees C to get another 3000 Angstroms thick undoped layer. Activation anneal at 1000 degrees C for 20 seconds provided a doped film of overall average dopant concentration of greater than $1 \times 10^{19}$ atoms/cm$^3$. Bulk resistivity was 1500 microohm-cm.

Run #2:

Same as above, except PH$_3$ treatment was at 800 degrees C. Bulk resistivity was 1000 microohm-cm.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming a conductively doped polysilicon plug, comprising:

forming an opening in an insulative layer;

forming a first layer of amorphous silicon within the opening, the first layer less than completely filling the opening to leave a remaining opening;

after forming the first layer, increasing a dopant concentration of the first layer by gas diffusion of a first dopant into the first layer;

forming a second layer of amorphous silicon within the remaining opening;

after forming the second layer within the remaining opening, increasing a dopant concentration of the second layer by gas diffusion of a second dopant into the second layer;

after the gas diffusion of the first dopant, transforming the first layer to polysilicon; and after the gas diffusion of the second dopant, transforming the second layer to polysilicon.

2. The method of claim 1 wherein the second dopant and the first dopant consist of identical chemical compositions.

3. A semiconductor processing method of forming a conductively doped polysilicon plug within a contact opening, comprising:

providing a node location to which electrical connection with a conductively doped polysilicon plug is to be made;

forming a plug molding layer outwardly of the node location;

forming a contact opening through the plug molding layer to the node location;

forming a first layer of amorphous silicon within the contact opening, the first layer less than completely filling the contact opening to leave a first remaining opening;

after forming the first layer within the contact opening, increasing an average conductivity enhancing dopant concentration of the first layer by a gas diffusion process, the gas diffusion process providing dopant substantially uniformly throughout an entirety of the first layer within the contact opening;

forming a second layer of amorphous silicon within the first remaining opening;

after forming the second layer within the first remaining opening, increasing an average conductivity enhancing dopant concentration of the second layer by a gas diffusion process, the gas diffusion process providing dopant substantially uniformly throughout an entirety of the second layer within the first remaining opening;

transforming the first layer to polysilicon;

transforming the second layer to polysilicon; and the first and second transformed layers defining at least a portion of a conductively doped semiconductive material plug within the contact opening.

4. The method of claim 3 wherein the increasing the increasing an average conductivity enhancing dopant concentration of the second layer occurs after the increasing an average conductivity enhancing dopant concentration of the first layer.

5. The method of claim 3 wherein the second layer only partially fills the first remaining opening to leave a second remaining opening, the method further comprising:

forming a third layer of amorphous silicon over the second layer and to within the second remaining opening;

providing a dopant within the third layer of amorphous silicon; and transforming the third layer to polysilicon.

6. The method of claim 3 wherein the second layer only partially fills the first remaining opening to leave a second remaining opening, the method further comprising:

forming a third layer of amorphous silicon over the second layer and to within the second remaining opening;

providing a dopant within the third layer of amorphous silicon by gas diffusion; and transforming the third layer to polysilicon.

7. A semiconductor processing method of forming a conductively doped polysilicon plug within a contact opening, comprising:

providing a node location to which electrical connection with a conductively doped polysilicon plug is to be made;

forming a plug molding layer outwardly of the node location;

forming a contact opening through the plug molding layer to the node location;

forming a first layer of amorphous silicon within the contact opening, the first layer less than completely filling the contact opening to leave a first remaining opening, the first layer having an average conductivity enhancing dopant concentration of less than about $5\times10^{18}$ atoms/cm$^3$;

after forming the first layer within the contact opening, increasing an average conductivity enhancing dopant concentration of the first layer to greater than or equal to about $1\times10^{19}$ atoms/cm$^3$;

after increasing the average dopant concentration of the first layer, forming a second layer of amorphous silicon within the first remaining opening, the second layer having an average conductivity enhancing dopant concentration of less than about $5\times10^{18}$ atoms/cm$^3$;

after forming the second layer within the first remaining opening, increasing an average conductivity enhancing dopant concentration of the second layer to greater than or equal to about $1\times10^{19}$ atoms/cm$^3$;

transforming the first layer to polysilicon;

transforming the second layer to polysilicon; and the first and second transformed layers defining at least a portion of a conductively doped semiconductive material plug within the contact opening.

8. A semiconductor processing method of forming a conductively doped polysilicon plug within a contact opening, comprising:

providing a node location to which electrical connection with a conductively doped polysilicon plug is to be made;

forming a plug molding layer outwardly of the node location;

forming a contact opening through the plug molding layer to the node location;

forming a first layer of amorphous silicon within the contact opening, the first layer less than completely filling the contact opening to leave a first remaining opening, the first layer having an average conductivity enhancing dopant concentration of less than about $5\times10^{18}$ atoms/cm$^3$;

after forming the first layer within the contact opening, increasing an average conductivity enhancing dopant concentration of the first layer to greater than or equal to about $1\times10^{19}$ atoms/cm$^3$;

after increasing the average dopant concentration of the first layer, forming a second layer of amorphous silicon within the first remaining opening, the second layer less than completely filling the contact opening to leave a second remaining opening, the second layer having an average conductivity enhancing dopant concentration of less than about $5\times10^{18}$ atoms/cm$^3$;

after forming the second layer within the first remaining opening, increasing an average conductivity enhancing dopant concentration of the second layer to greater than or equal to about $1\times10^{19}$ atoms/cm$^3$;

after increasing the average dopant concentration of the second layer, forming a third layer of amorphous silicon within the second remaining opening, the third layer having an average conductivity enhancing dopant concentration of less than about $5\times10^{18}$ atoms/cm$^3$;

after forming the third layer within the first remaining opening, increasing an average conductivity enhancing dopant concentration of the third layer to greater than or equal to about $1\times10^{19}$ atoms/cm$^3$;

transforming the first layer to polysilicon;

transforming the second layer to polysilicon;

transforming the third layer to polysilicon; and the first, second and third transformed layers defining at least a portion of a conductively doped semiconductive material plug within the contact opening.

9. A semiconductor processing method of forming a conductively doped polysilicon plug within a contact opening comprising the following steps:

forming a node location to which electrical connection with a conductively doped polysilicon plug is to be made;

forming a plug molding layer outwardly of the node location, the plug molding layer comprising SiO$_2$;

forming a contact opening through the plug molding layer to the node location, the contact opening having an opening width;

forming a first layer of amorphous silicon over the molding layer to within the contact opening, the first layer being formed to a thickness which is less than one-half the contact opening width to less than completely fill the contact opening with the first layer and leave a first remaining opening, the first layer of amorphous silicon being substantially undoped in having an average conductivity enhancing dopant concentration from 0 atoms/cm$^3$ to about $5\times10^{18}$ atoms/cm$^3$;

after forming the first layer within the contact opening, increasing the average conductivity enhancing dopant concentration of the first layer by a gas diffusion process to greater than or equal to about $1\times10^{19}$ atoms/cm$^3$, the gas diffusion process providing dopant substantially uniformly throughout an entirety of the first layer within the contact opening;

after increasing the dopant concentration of the first layer, forming a second layer of amorphous silicon over the first layer and to within the first remaining opening, the second layer of amorphous silicon being substantially undoped;

after forming the second layer within the first remaining opening, increasing the average conductivity enhancing dopant concentration of the second layer by a gas diffusion process to greater than or equal to about $1 \times 10^{19}$ atoms/cm$^3$, the gas diffusion process providing dopant substantially uniformly throughout an entirety of the second layer within the first remaining opening;

transforming the first layer to polysilicon;

transforming the second layer to polysilicon; and the first and second transformed layers defining at least a portion of a conductively doped semiconductive material plug within the contact opening.

\* \* \* \* \*

UNITED STATES PATENT AND TRADEMARK OFFICE
CERTIFICATE OF CORRECTION

PATENT NO. : 6,067,680
DATED : May 30, 2000
INVENTOR(S) : Pai-Hung Pan et al

It is certified that error appears in the above-identified patent and that said Letters Patent are hereby corrected as shown below:

Column 4, line 26 delete "14" before of.

Column 4, line 43 "evens" should be --events--.

Column 6, Claim 4 delete the duplicate words "the increasing".

Signed and Sealed this

Seventeenth Day of April, 2001

Attest:

NICHOLAS P. GODICI

*Attesting Officer*      *Acting Director of the United States Patent and Trademark Office*